(12) United States Patent
Lei et al.

(10) Patent No.: US 9,601,392 B1
(45) Date of Patent: Mar. 21, 2017

(54) DEVICE CHARACTERIZATION BY TIME DEPENDENT CHARGING DYNAMICS

(71) Applicant: GLOBALFOUNDRIES Inc., Grand Cayman (KY)

(72) Inventors: Ming Lei, Ballston Lake, NY (US); Byoung-Gi Min, Cohoes, NY (US); Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/927,943

(22) Filed: Oct. 30, 2015

(51) Int. Cl.
*H01L 21/66* (2006.01)
*H01L 27/11* (2006.01)

(52) U.S. Cl.
CPC .............. *H01L 22/14* (2013.01); *H01L 22/30* (2013.01); *H01L 27/1104* (2013.01)

(58) Field of Classification Search
CPC ....................................................... H01L 22/14
See application file for complete search history.

(56) References Cited

U.S. PATENT DOCUMENTS

| | | | | |
|---|---|---|---|---|
| 7,635,843 | B1* | 12/2009 | Luo | H01L 22/12 250/307 |
| 2004/0207414 | A1* | 10/2004 | Verma | H01L 22/34 324/754.22 |
| 2009/0102501 | A1* | 4/2009 | Guldi | G01R 31/2884 324/754.22 |
| 2010/0258720 | A1* | 10/2010 | Xiao | G01R 31/307 250/307 |
| 2013/0094315 | A1* | 4/2013 | Patterson | G11C 29/50008 365/201 |
| 2013/0300451 | A1* | 11/2013 | Patterson | G01R 31/2653 324/762.05 |

* cited by examiner

*Primary Examiner* — Bryan Junge
(74) *Attorney, Agent, or Firm* — Dittavong & Steiner, P.C.

(57) ABSTRACT

A method and device for characterizing a DC parameter of a SRAM device based on TDCD are provided. Embodiments include forming a SRAM test device, the SRAM test device having a top edge and a bottom edge and at least a first and a second S/D contact, a gate contact, and a channel region; inducing an inversion charge in the channel region through the gate contact; scanning the first S/D contact with an ebeam subsequent to inducing the inversion charge; and characterizing at least one DC parameter of the SRAM test device based on a dissipation of the inversion charge between the steps of inducing and scanning

13 Claims, 4 Drawing Sheets

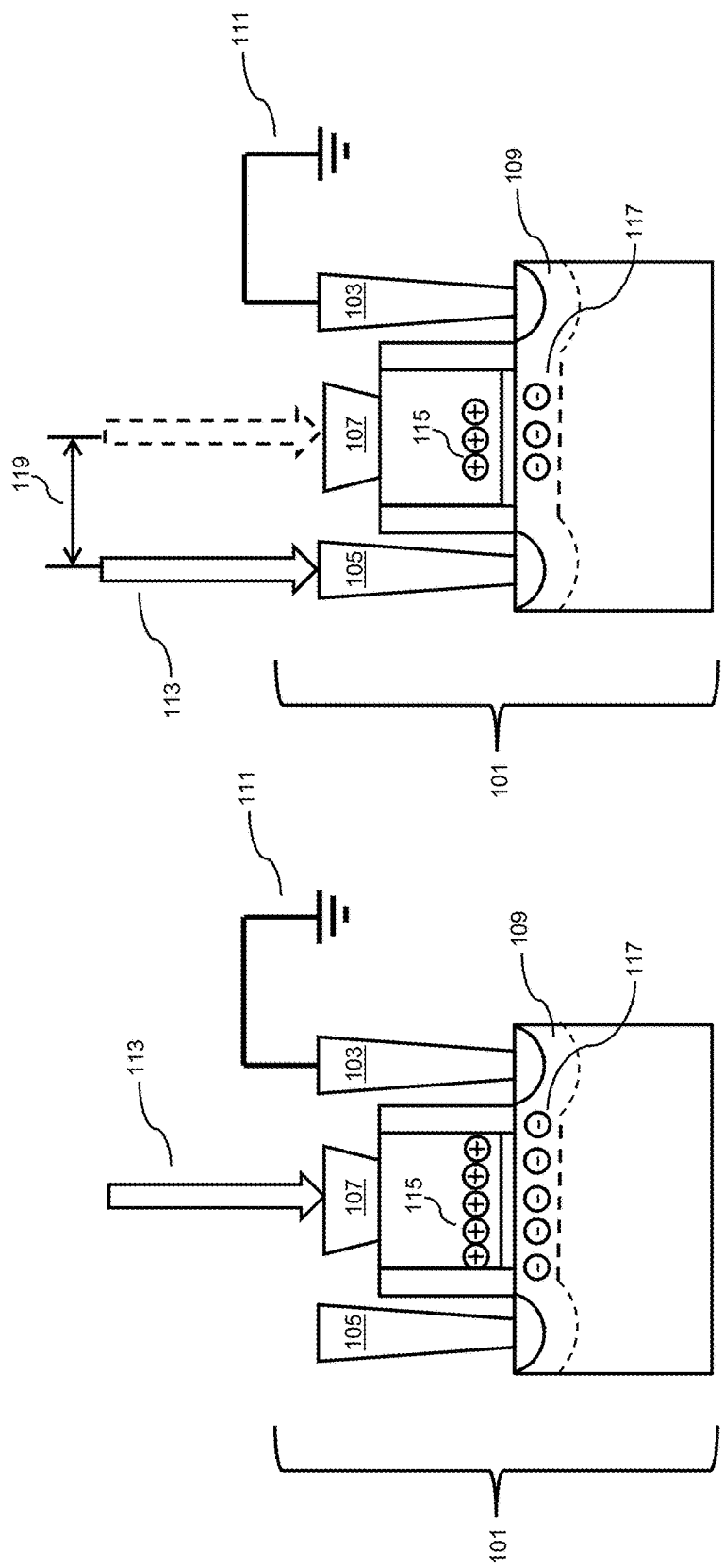

DEVICE CHARACTERIZATION BY TIME DEPENDENT CHARGING DYNAMICS

TECHNICAL FIELD

The present disclosure relates to a manufacture of semiconductor devices such as metal-oxide-semiconductor field-effect transistor (MOSFET) devices. The present disclosure is particularly applicable to the 14 nanometer (nm) technology node and beyond.

BACKGROUND

Conventional electrical testing can provide a comprehensive characterization of critical device parameters. However, the testing cycle time is often too slow for massive semiconductor production. Electron beam inspection (EBI) is a popular in-line defect detection metrology technique which is mostly limited to hard fail defect monitoring. However, it remains uncertain how EBI can be used to characterize critical device properties largely due to fundamental challenges to quantifying the electric responses of semiconductor devices under electron beam (ebeam) exposure.

A need therefore exists for methodology and a device enabling the characterization of critical device properties under ebeam exposure.

SUMMARY

An aspect of the present disclosure is a method of characterizing a direct current (DC) parameter of a static random-access memory (SRAM) device based on time dependent charging dynamics (TDCD).

Another aspect of the present disclosure is a device for enabling the characterization of a DC parameter of a SRAM device under ebeam exposure based on TDCD.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a SRAM test device, the SRAM test device having a top edge and a bottom edge and at least a first and a second source/drain (S/D) contact, a gate contact, and a channel region; inducing an inversion charge in the channel region through the gate contact; scanning the first S/D contact with an ebeam subsequent to inducing the inversion charge; and characterizing at least one DC parameter of the SRAM test device based on a dissipation of the inversion charge between the steps of inducing and scanning Aspects of the present disclosure include forming the SRAM test device by: modifying gate cut region (CT), trench contact (TT), S/D contact (CA), and gate contact (CB) masks corresponding to a design rule and process flow for forming a standard SRAM to meet a design requirement for detecting a TDCD effect with respect to the first S/D contact. Other aspects include modifying the CT, TT, CA, and CB masks, respectively, by: separating gates of the CT mask between (1) n-type field effect transistors (n-FETs) and (2) p-type field effect transistors (p-FETs) or dummy p-FETs so that a same type of transistor shares a same gate; removing trench silicide (TS) contacts from the TT mask for the dummy p-FETs to enable the TDCD effect on a pull-up (PU) transistor; removing ground contacts from the CA mask to enable the TDCD effect on a pull-down (PD) transistor; and adding gate contacts to the CB mask for the PD transistor and/or using one or more share contacts of the PU transistor as one or more gate contacts. Further aspects include inducing the inversion charge by: connecting the second S/D contact to a virtual ground; and scanning the gate contact with the ebeam one or more times in a Y direction from the top edge down to the bottom edge prior to scanning the first S/D contact. Additional aspects include connecting the first S/D to a top and a bottom bit line (BL), the top and the bottom BL vertically separated in a straight line with the top BL formed closer to the top edge of the SRAM test device. Another aspect includes scanning the first S/D contact by: causing a delay between scanning the gate contact and scanning the first S/D contact; and scanning the top and bottom BL in a Y direction starting from the top edge of the SRAM test device down to the bottom edge. Other aspects include characterizing the at least one DC parameter of the SRAM test device by: measuring a change of a grey value for the top BL, the grey value directly related to a resistance value of the channel region.

Another aspect of the present disclosure is a device including: a semiconductor substrate, the semiconductor substrate having a top and a bottom edge and including a first and second dummy p-FET, a first and second p-FET, and a first and second n-FET; a first, a second, and a third group of gates, the first group of gates connecting the first dummy p-FET and the first p-FET, the second group of gates connecting the first and second n-FETs, and the third group of gates connecting the second dummy p-FET and the second p-FET; a first and second group of bit lines; and a first, a second, and a third group of word lines, a first and a second word line of the second group of word lines connected to a first and a second pair of gates of the second group of gates, respectively.

Aspects of the device include the first and second word lines being formed perpendicular to and equidistant between the first and second groups of bit lines. Other aspects include the first and second dummy p-FETs being formed in parallel, vertically separated, and proximate to the top and bottom edges of the semiconductor substrate, respectively, the first and second p-FETs being formed in parallel and vertically separated between the first and second dummy p-FETs, and the first and second n-FETs being formed in parallel and vertically separated between the first and second p-FETs. Further aspects include the device being formed with a first, a second, a third, and a fourth group of TS contacts; a first and a second group of share contacts; and a first, a second, and a third group of voltage supply (Vdd). Additional aspects include a pair of the first group of share contacts acting as a gate contact for a first PU transistor and a pair of the second group of share contracts acting as a gate contact for a second PU transistor. Another aspect includes the first group of TS contacts being connected to the first p-FET and the first n-FET, the second group of TS contacts being connected to the first n-FET, the third group of TS contacts is connected to the second n-FET, and the fourth group of TS contacts being connected to the second n-FET and the second p-FET. Other aspects include each bit line of the first group of bit lines being connected to each TS contact of the second group of TS contacts, respectively, and each bit line of the second group of bit lines being connected to each TS contact of the third group of TS contacts, respectively.

A further aspect of the present disclosure is a method including: forming a SRAM test device, the SRAM test device having a top edge and a bottom edge and at least a first and a second S/D contact, a gate contact, and a channel region; connecting the first S/D contact to a virtual ground; scanning the gate contact with an ebeam one or more times in a Y direction from the top edge down to the bottom edge, the scanning inducing an inversion charge in the channel region; scanning the second S/D contact with the ebeam subsequent to scanning the gate contact; and characterizing at least one DC parameter of the SRAM test device based on a dissipation of the inversion charge between the steps of scanning the gate contact and scanning the second S/D contact.

Aspects of the present disclosure include forming the SRAM test device by: modifying CT, TT, CA, and CB masks corresponding to a design rule and process flow for forming a standard SRAM to meet a design requirement for detecting a TDCD effect with respect to the second S/D contact. Other aspects include modifying the CT, TT, CA, and CB masks, respectively, by: separating gates of the CT mask between (1) n-FETs and (2) p-FETs or dummy p-FETs so that a same type of transistor shares a same gate; removing TS contacts from the TT mask for the dummy p-FETs to enable the TDCD effect on a PU transistor; removing ground contacts from the CA mask to enable the TDCD effect on a PD transistor; and adding gate contacts to the CB mask for the PD transistor and/or using one or more share contacts of the PU transistor as one or more gate contacts. Further aspects include connecting the second S/D contact to a top and a bottom BL, the top and the bottom BL vertically separated in a straight line with the top BL formed closer to the top edge of the SRAM test device. Additional aspects include scanning the second S/D contact by: causing a delay between scanning the gate contact and scanning the second S/D contact; and scanning the top and the bottom BL in a Y direction starting from the top edge of the SRAM test device down to the bottom edge. Another aspect includes characterizing the at least one DC parameter of the SRAM test device by: measuring a change of a grey value for the top BL, the grey value directly related to a resistance value of the channel region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1A and 1B schematically illustrate the physical principle of a MOSFET device TDCD under ebeam exposure, in accordance with an exemplary embodiment;

DETAILED DESCRIPTION

Figure 2A:
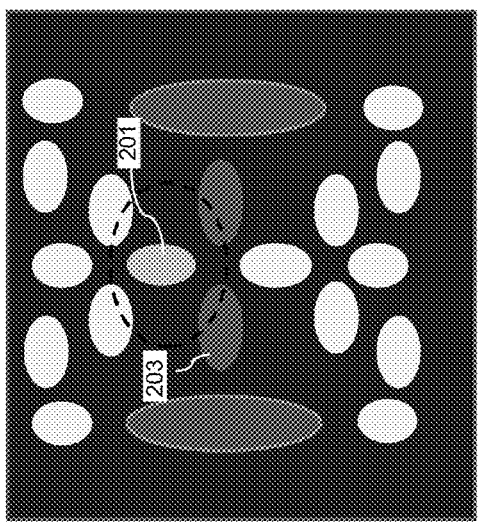
FIGS. 2A through 2C schematically illustrate the TDCD effect from a passing transistor (PT) in a SRAM device under ebeam exposure, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of understanding how EBI can be used to characterize critical device properties and an inability to detect the TDCD effect from PU and PD transistors attendant upon forming a SRAM device.

Methodology in accordance with embodiments of the present disclosure includes forming a SRAM test device, the SRAM test device having a top edge and a bottom edge and at least a first and a second S/D contact, a gate contact, and a channel region. An inversion charge is induced in the channel region through the gate contact. The first S/D contact is scanned with an ebeam subsequent to inducing the inversion charge, and at least one DC parameter of the SRAM test device is characterized based on a dissipation of the inversion charge between the steps of inducing and scanning.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A and 1B (a cross-sectional view) schematically illustrate the physical principle for a MOSFET device TDCD under ebeam exposure, in accordance with an exemplary embodiment. Adverting to FIG. 1A, a MOSFET device 101 including a S/D contact 103 and a S/D contact 105, a gate contact 107, and a channel region 109 is provided. The S/D contact 103 is connected to a virtual ground 111, e.g., a p-type node under a positive charging condition, and the S/D contact 105 is connected to a bit line (not shown for illustrative convenience) for measurement purposes. The virtual ground 111 provides a supply of electrons to establish the channel resistance modulated by the remaining inversion charges. When the gate contact 107 is positively charged, e.g., under the ebeam exposure 113, the positive charges 115 induce the inversion charges 117 in the channel region 109. However, the charging of the gate contact 107 alone is not enough to characterize any parameters of the device 101. Rather, the charging of the gate contact 107 only provides charges to switch on the channel 109 until the surface potential of the device 101 saturates.

Adverting to FIG. 1B, the induced inversion charges 117, however, can be measured by scanning the S/D 105 with the ebeam 113 subsequent to inducing the inversion charges 117. Upon a controllable time delay between the charge pumping at the gate contact 107 and the detection at the S/D contact 105, as depicted by the arrow 119, the S/D contact 105 will become darker as the inversion charges 117 gradually dissipate. The S/D contact 105 gradually becomes darker as a result of the increased resistance and the higher surface potential barrier for the scanning electrons to escape. This dissipation and darkening is known as the TDCD effect. Consequently, at least one DC parameter, e.g., the channel resistance, of the SRAM device can be characterized based on TDCD.

Figure 2B:
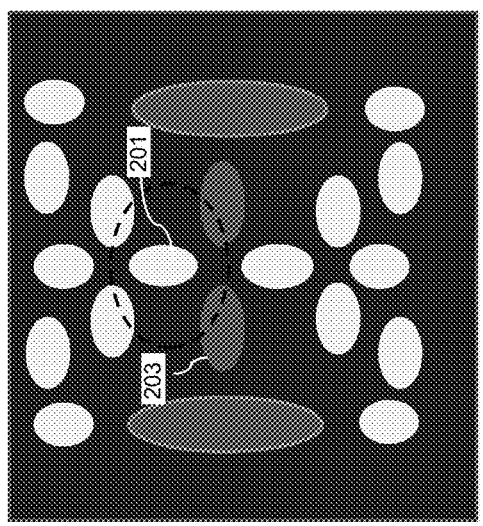
Figure 2C:
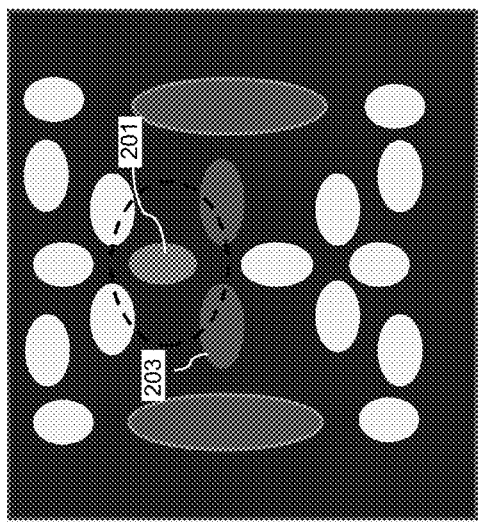

FIGS. 2A through 2C (simulated scanning electron microscope (SEM) images from a SRAM device) schematically illustrate the TDCD effect from a PT in a SRAM device under ebeam exposure, in accordance with an exemplary embodiment. For a standard SRAM design, only the PT satisfies the requirement for the TDCD effect. PD and PU transistors are already connected to gates and S/D terminals of a virtual ground, e.g., a p-node, and, therefore, the device will not respond to the TDCD effect under a positive surface charge mode. In this example, the TDCD effect from the PT can be observed in the BL 201. This is possible because, as discussed above, the other source end is connected to a p-node through a share contact (not shown for illustrative convenience) which acts as a virtual ground, and there are separate metal contacts for the gate and drain denoted as world line (WL) 203 and BL 201, respectively. The time delay between charging the WL 203 and detecting the BL 201 causes the BL 201 to start to dim off, as sequentially depicted in FIGS. 2A through 2C, respectively. The change of the grey level of the BL 201 resulting from the TDCD effect, and which is related to the change in channel resistance, can be used to characterize the PT DC device parameters. Only the TDCD effect from a n-FET under positive surface charge is discussed herein; however, it is contemplated that a similar TDCD effect can also be induced from a p-FET transistor under a negative charge condition.

Figure 3:
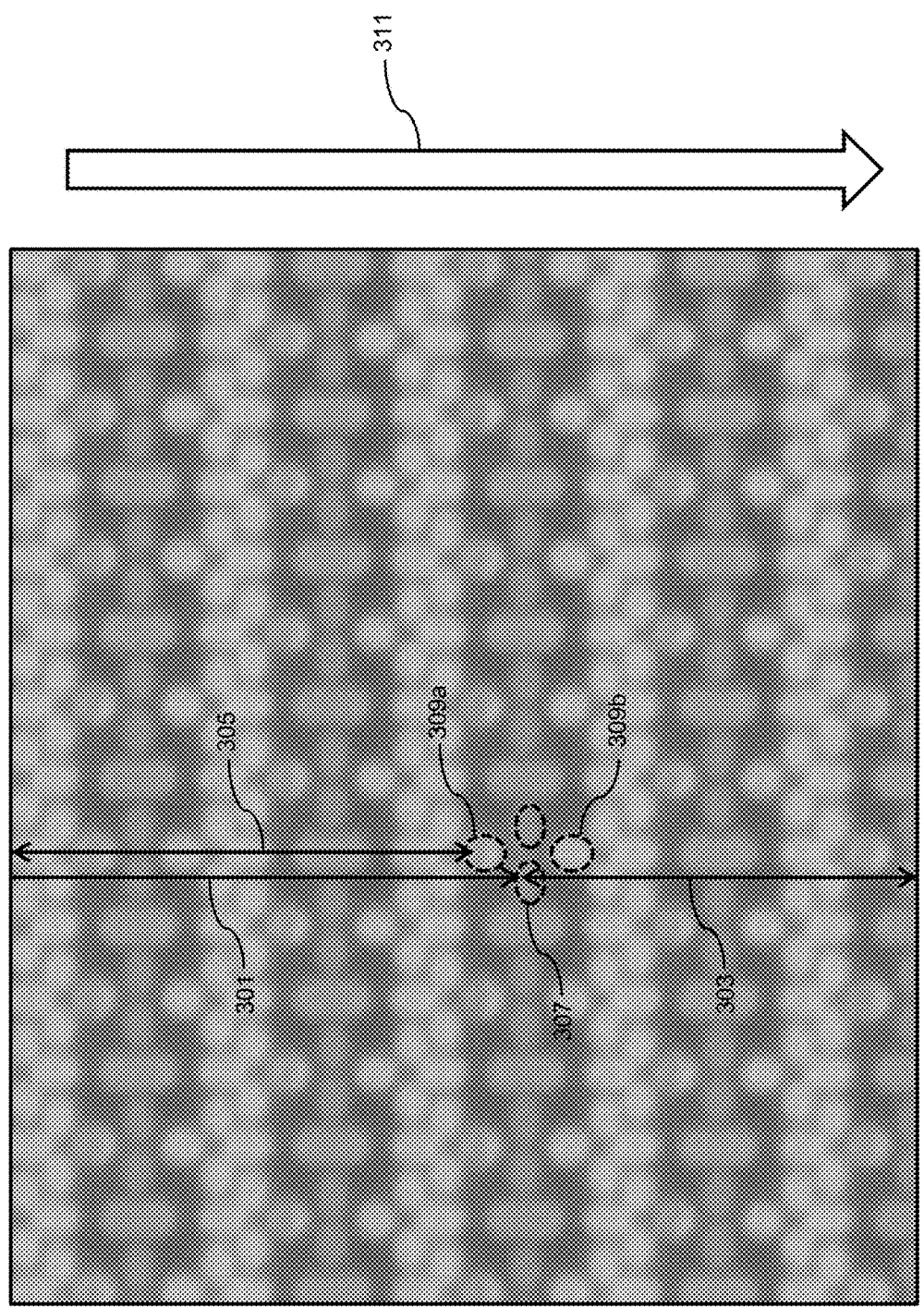
FIG. 3 schematically illustrates an example delay time for scanning a SRAM device under ebeam exposure, in accordance with an exemplary embodiment.

FIG. 3 (an example SEM image of a portion of a SRAM device) schematically illustrates an example delay time for scanning a SRAM device under ebeam exposure, in accordance with an exemplary embodiment. Adverting to FIG. 3, an ebeam depicted by the paths 301, 303, and 305 first induces an inversion charge in a gate contact by scanning the word line 307 one or more times from the top edge of the device down to the bottom edge prior to scanning the bit line 309, which includes a bit line "above" 309a and a bit line "below" 309b. Although depicted as two paths, e.g., paths 301 and 303, the ebeam actually travels in a single path as depicted by the arrow 311. Due to scan width (SW) limitation, the direct setting of a delay time is not possible on current tool platforms. One example workaround is to increase the "dot average," i.e., increase the dwell time of the ebeam for each pixel. Consequently, by coupling the "dot average" and scan width, a larger delay time than normally would be possible can be applied. However, as a result of the coupling, the time resolution becomes compromised and, therefore, only the TDCD effect of the bit line "above" 309a can currently be observed. Another possible way to introduce the delay is through controlling the delay time between adjacent scan lines while maintaining the other scan setting constant.

In this example, the time delay is equal to the sum of the travel path 303 (after scanning the word line 307 to the bottom of the device), the travel path 305 (from the top of the device to the bit line "above" 309a), and the time that it takes the ebeam to "return" to the top of the device. In this example, the time delay is equal to 10 nanosecond (ns) x scan width x dot average +350 ns (the time that it takes for the ebeam to return to the top of the device). Because there is an upper limit for the dot average which limits the maximum delay that can currently be reached, there is only a large enough delay time to observe the TDCD effect in the bit line "above" 309a. In contrast, the bit line "below" 309b is always "on" as a result of the ebeam exposure. It is contemplated that once a direct setting of delay/dwell time is available on tool platforms to improve the time resolution, the bit line "below" 309b can be dynamically switched also and, therefore, the TDCD effect may be observed for the bit line "below" 309b as well.

Figures 4, 5:
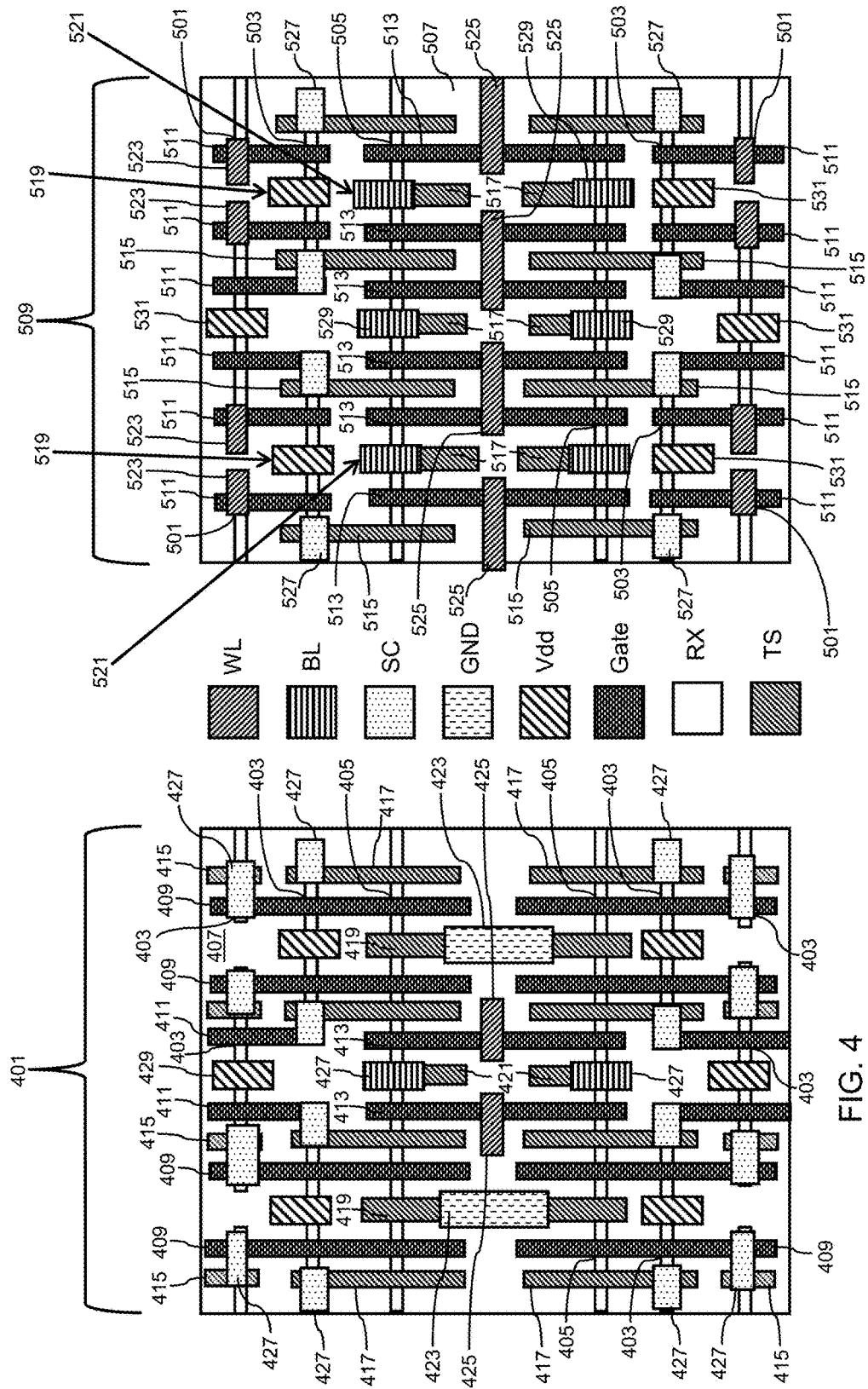
FIG. 4 schematically illustrates a background SRAM device.
FIG. 5 schematically illustrates a test device for characterizing the TDCD effects of all SRAM transistor types, in accordance with an exemplary embodiment.

Adverting to FIG. 4, a background SRAM device 401 may be formed with p-FETs 403 and n-FETs 405 over active channel regions (RX) on a semiconductor substrate 407. A SRAM test device may be formed following the same general design rule and process flow as the SRAM device 401. For example, dummy p-FETs 501, p-FETs 503, and n-FETs 505 are formed on a semiconductor substrate 507 of a SRAM test device 509, as depicted in FIG. 5. However, the SRAM test device 509 is unlike the SRAM device 401 because the CT, TT, CA, and CB masks for forming the SRAM device 401 are modified to form the SRAM test device 509 so that the TDCD effect may be observed with respect to the PT, PD, and PU transistors rather than just the PT.

The CT mask for forming the standard SRAM device 401 is modified by separating the gates between n-FETs and p-FETs or dummy p-FETs so that the same type of transistor shares a same gate. For example, in the SRAM device 401, gates 409 are connecting the p-FETs 403 and the n-FETs 405, gates 411 are connecting a portion of the p-FETs 403, and gates 413 are connecting the n-FETs 405. In contrast, in the SRAM test device 509, gates 511 are connecting the dummy p-FETs 501 and the p-FETs 503, and gates 513 are connecting the n-FETs 505.

The TT mask for forming the SRAM test device 509 is modified relative to the TT mask for forming the SRAM device 401 by removing the TS contacts for the dummy p-FETs 501. For example, in the SRAM device 401, TS contacts 415 are connected to the p-FETs 403, TS contacts 417 are connecting the p-FETs 403 and the n-FETs 405, TS contacts 419 are connecting the n-FETs 405, and TS contacts 421 are connected to n-FETs 405. In contrast, in the SRAM test device 509, there are no TS contacts connected to the dummy p-FETs 501. Rather, TS contacts 515 are connecting the p-FETs 503 and the n-FETs 505 and TS contacts 517 are connected to n-FETs 505. As a result, the TDCD effect from a PU transistor (under a negative surface charging mode), which was previously unobservable with respect to the SRAM device 401, may now be observed. The PU nodes are depicted by the arrows 519.

The CA mask for forming the SRAM test device 509 is modified relative to the CA mask for forming the SRAM device 401 by removing the ground contacts. For example, in the SRAM device 401, ground contacts 423 are connected to the TS contacts 419. By removing the ground contacts, the TDCD effect from a PD transistor, which was previously unobservable with respect to the SRAM device 401, may now be observed. The PD nodes are depicted by the arrows 521.

The CB mask for forming the SRAM test device 509 is modified relative to the CB mask for forming the SRAM device 401 by adding gates contacts or word lines for the PD transistors. For example, the standard SRAM device 401 is formed with two gate contacts or word lines 425, which are each connected to a gate 413. In contrast, in the SRAM test device 509, each gate contact or word line 523 is connected to a gate 511, and each gate contact or word line 525 is connected to a gate 513. In addition, at least two of the gate contacts or word lines 525 are each connecting a pair of gates 513. Further, in the SRAM device 401, each share contact 427 is connected to a p-FET 403, whereas in the SRAM test device 509, there are no share contacts 527 connected to the dummy p-FETs 501. Rather, the share contacts 527 are connected to TS contacts 515 on the PU transistors and may be used as gate contacts since there are no TS contacts connected to the dummy p-FETs 503.

In this example, the SRAM test device 509 includes six bit lines 529, and each is connected to a TS contact 517. The word lines 525 are formed perpendicular to and equidistant between the bit lines 529. In contrast, in the SRAM device 401, there are only two bit lines 427. Further, both the SRAM device 401 and the SRAM test device 509 include Vdd 429 and 531, respectively.

The embodiments of the present disclosure can achieve several technical effects including enabling detection of the TDCD effect from all three types of SRAM transistors—PT, PD, and PU and, therefore, enabling measurement of the critical device parameters from PT, PD, and PU transistors. The methodology can also work on logic region with inverter structures and the TDCD effects can be used to provide fast, early, and non-destructive device information by in-line metrology. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices in the 14 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a static random-access memory (SRAM) test device, the SRAM test device having a top edge and a bottom edge and at least a first and a second source/drain (S/D) contact, a gate contact, and a channel region;
    inducing an inversion charge in the channel region through the gate contact;
    scanning the first S/D contact with an electron beam (ebeam) subsequent to inducing the inversion charge; and
    characterizing at least one direct current (DC) parameter of the SRAM test device based on a dissipation of the inversion charge between the steps of inducing and scanning.

2. The method according to claim 1, comprising forming the SRAM test device by:
    modifying gate cut region (CT), trench contact (TT), S/D contact (CA), and gate contact (CB) masks corresponding to a design rule and process flow for forming a standard SRAM to meet a design requirement for detecting a time dependent charging dynamics (TDCD) effect with respect to the first S/D contact.

3. The method according to claim 2, comprising modifying the CT, TT, CA, and CB masks, respectively, by:
    separating gates of the CT mask between (1) n-type field effect transistors (n-FETs) and (2) p-type field effect transistors (p-FETs) or dummy p-FETs so that a same type of transistor shares a same gate;
    removing trench silicide (TS) contacts from the TT mask for the dummy p-FETs to enable the TDCD effect on a pull-up (PU) transistor;
    removing ground contacts from the CA mask to enable the TDCD effect on a pull-down (PD) transistor; and
    adding gate contacts to the CB mask for the PD transistor and/or using one or more share contacts of the PU transistor as one or more gate contacts.

4. The method according to claim 1, comprising inducing the inversion charge by:
    connecting the second S/D contact to a virtual ground; and
    scanning the gate contact with the ebeam one or more times in a Y direction from the top edge down to the bottom edge prior to scanning the first S/D contact.

5. The method according to claim 1, comprising connecting the first S/D contact to a top and a bottom bit line (BL), the top and the bottom BL vertically separated in a straight line with the top BL formed closer to the top edge of the SRAM test device.

6. The method according to claim 5, comprising scanning the first S/D contact by:
    causing a delay between scanning the gate contact and scanning the first S/D contact; and
    scanning the top and bottom BL in a Y direction starting from the top edge of the SRAM test device down to the bottom edge.

7. The method according to claim 5, characterizing the at least one DC parameter of the SRAM test device by:
    measuring a change of a grey value for the top BL, the grey value directly related to a resistance value of the channel region.

8. A method comprising:
    forming a static random-access memory (SRAM) test device, the SRAM test device having a top edge and a bottom edge and at least a first and a second source/drain (S/D) contact, a gate contact, and a channel region;
    connecting the first S/D contact to a virtual ground;
    scanning the gate contact with an electron beam (ebeam) one or more times in a Y direction from the top edge down to the bottom edge, the scanning inducing an inversion charge in the channel region;
    scanning the second S/D contact with the ebeam subsequent to scanning the gate contact; and
    characterizing at least one direct current (DC) parameter of the SRAM test device based on a dissipation of the inversion charge between the steps of scanning the gate contact and scanning the second S/D contact.

9. The method according to claim 8, comprising forming the SRAM test device by:
    modifying gate cut region (CT), trench contact (TT), S/D contact (CA), and gate contact (CB) masks corresponding to a design rule and process flow for forming a standard SRAM to meet a design requirement for detecting a time dependent charging dynamics (TDCD) effect with respect to the second S/D contact.

10. The method according to claim 9, comprising modifying the CT, TT, CA, and CB masks, respectively, by:
   separating gates of the CT mask between (1) n-type field effect transistors (n-FETs) and (2) p-type field effect transistors (p-FETs) or dummy p-FETs so that a same type of transistor shares a same gate;
   removing trench silicide (TS) contacts from the TT mask for the dummy p-FETs to enable the TDCD effect on a pull-up (PU) transistor;
   removing ground contacts from the CA mask to enable the TDCD effect on a pull-down (PD) transistor; and
   adding gate contacts to the CB mask for the PD transistor and/or using one or more share contacts of the PU transistor as one or more gate contacts.

11. The method according to claim 8, comprising connecting the second S/D contact to a top and a bottom bit line (BL), the top and the bottom BL vertically separated in a straight line with the top BL formed closer to the top edge of the SRAM test device.

12. The method according to claim 11, comprising scanning the second S/D contact by:
   causing a delay between scanning the gate contact and scanning the second S/D contact; and
   scanning the top and the bottom BL in a Y direction starting from the top edge of the SRAM test device down to the bottom edge.

13. The method according to claim 8, characterizing the at least one DC parameter of the SRAM test device by:
   measuring a change of a grey value for the top BL, the grey value directly related to a resistance value of the channel region.

* * * * *